United States Patent
Li

(10) Patent No.: US 6,276,997 B1
(45) Date of Patent: Aug. 21, 2001

(54) USE OF CHEMICAL MECHANICAL POLISHING AND/OR POLY-VINYL-ACETATE SCRUBBING TO RESTORE QUALITY OF USED SEMICONDUCTOR WAFERS

(76) Inventor: Shinhwa Li, 7407 West Robin La., Glendale, AZ (US) 85310

( * ) Notice: Subject to any disclaimer, the term of this patent is extended or adjusted under 35 U.S.C. 154(b) by 0 days.

(21) Appl. No.: 09/219,684

(22) Filed: Dec. 23, 1998

(51) Int. Cl.$^7$ .................................................... H01L 21/00
(52) U.S. Cl. .................. 451/41; 451/36; 451/37; 451/54; 451/59; 451/67; 438/690; 438/692; 134/1.3
(58) Field of Search ................. 451/41, 36, 37, 451/54, 59, 66, 67, 910; 438/689–692, 476, 959; 134/1.2, 1.3, 3, 902; 15/21.1

(56) References Cited

U.S. PATENT DOCUMENTS

| | | | |
|---|---|---|---|
| 5,131,979 | * 7/1992 | Lawrence | 156/655 |
| 5,920,764 | * 7/1999 | Hanson et al. | 438/4 |
| 5,966,766 | * 10/1999 | Shipley et al. | 15/102 |
| 6,050,884 | * 4/2000 | Togawa et al. | 451/67 |
| 6,070,600 | * 6/2000 | Grootegoed et al. | 134/111 |

* cited by examiner

Primary Examiner—Eileen P. Morgan
(74) Attorney, Agent, or Firm—Hogan & Hartson LLP

(57) ABSTRACT

A method for restoring a used semiconductor substrate or wafer, the method comprising using a PVA scrubbing means to remove particles or residues on the surface of the substrate or wafer such that the substrate or wafer may return to their respective virgin state for reuse, the method may further comprising a procedure of acid stripping for removing deposits on the surface of the substrate or wafer before the procedure of scrubbing, or a procedure of CMP for polishing the substrate or wafer before the procedure of scrubbing, or a procedure of cleaning the substrate or wafer after the procedure of scrubbing.

17 Claims, 1 Drawing Sheet

USE OF CHEMICAL MECHANICAL POLISHING AND/OR POLY-VINYL-ACETATE SCRUBBING TO RESTORE QUALITY OF USED SEMICONDUCTOR WAFERS

FIELD OF THE INVENTION

The present invention relates generally to a semiconductor wafer, and more particularly to a method of using a Chemical Mechanical Polishing (CMP) and/or a Poly-Vinyl-Acetate (PVA) scrubbing to restore used semiconductor wafers in order to reclaim the wafers suitable for reuse.

BACKGROUND OF THE INVENTION

The semiconductor integrated circuit (IC) industry is arguably the most fast-growing industry in the world during the last several decades. Throughout the world, an incalculable number of semiconductor devices or circuits built on IC chips are needed each year. Thus, the whole IC industry consumes annually a tremendous amount of semiconductor wafers in making these chip products. In addition to the wafers used for making end IC chip products, a significant amount of monitoring wafers, ordinarily 10–15% of total production wafers per IC manufacturing factory, are used for a variety of testings during IC manufacturing processes. For example, for an IC fabricating factory with a capacity of processing 30,000 wafers per month, approximately 3,000 test wafers per month are needed for testing purposes.

The wafer testings during a manufacturing process are essential for the IC chip fabrication. The semiconductor manufacturing processes are extremely sensitive to any variations of operating conditions, such as, operating temperature, pressure, or humidity in the reactor, and are also equally sensitive to variations of manufacturing equipment calibration. For instance, before a batch of wafers may be processed, some test wafers have to be used to detect the particle contamination level of the equipment to avoid the waste of the whole batch. If the particle contamination level is too high, cleaning has to be performed on the equipment prior to any production processes. Also, the operating conditions of the semiconductor manufacturing equipment are extremely delicate. Thus, the testings qualify the stability of manufacturing equipment and allow an operator to make any necessary adjustments to the equipment before they are used to process the wafers. Depending on applications, each semiconductor factory typically runs one or more test per reactor per day for the production processes. As a result, a vast amount of test wafers are used in the IC industry annually.

In the past, few IC manufacturers reclaimed used or test wafers for later uses, and these used or test wafers were normally thrown away. Many factors had contributed to the reasons why previously IC makers did not reclaim the test wafers after being used. For example, the IC makers generally made good profits in the past, the cost of a new wafer was substantially similar to that of a used one, or the qualities of reclaimed wafers might be questionable due to lack of good reclaiming techniques. For whatever reasons, the whole semiconductor industry simply did not endeavor to reclaim used or test wafers. Nevertheless, the situation has notably been changed in the modern IC industry. Nowadays, the profit margin of IC manufacturing is generally declining and the cost savings for using reclaimed wafers have been greatly increased as the wafer size moves from 6 inches to 8 inches and then to 12 inches. Each 12-inch wafer typically produces up to 4 times the number of end chip products than a 6-inch wafer does. Thus, wasting a 12-inch wafer means a potential loss of up to four-times the revenue per wafer of a 6-inch wafer. The semiconductor industry thus began to reclaim test or used wafers during the last several years.

Some conventional techniques to reclaim used or test wafers have been developed during the last several years. In general, these conventional techniques include a first step of acid stripping, a second step of lapping/polishing, and a final step of cleaning the wafers. The acid stripping step is used to remove oxides or metals deposited on the test wafers. A test wafer is usually an unpatterned wafer deposited with oxides or metals, or both, over the test wafer. As a result, the first conventional step in reclaiming test wafers is to strip the oxides and/or metals deposited over the wafers. Stripping the oxides and/or metals is conventionally accomplished by using an acidic base chemical solution to etch and remove the oxides or metals from the wafers. To strip oxides or metals, the wafers may be immersed within a liquid tank containing the acidic chemical solution or the chemical solution may be dripped on the wafers to etch oxides or metals.

Merely using an acid bath to strip the oxides and/or metals is, however, not enough to restore the test or used wafers to their original pre-used condition because the after-stripped wafers normally still contain significant amount of defectivities, which may be particles on the surface or embedded defects in the outermost 1–2 $\mu$m depth of the silicon wafers. A restored wafer has to be extremely clean and free of defectivities before it can be reused. For example, during an IC manufacturing process, an important qualifying test for equipment used in the production is a defectivity level test, e.g., to test how many particles have been deposited or how many defects have been formed on the test wafers. As a result, all test wafers have to be virtually defectivity-free before they can be used for any test purposes to assure a reliable test result. Otherwise, if a defectivity-infested wafer is tested, it is impossible to qualify or disqualify an equipment tested due to a high signal/noise ratio. Almost all other applications, such as growing an epitaxial layer over a wafer, also require particle contamination free wafers. Nonetheless, although the acid bath stripping may remove the oxides and/or metals of the wafers, the wafers merely treated by the acid bath are often still infested with unwanted defectivities and are thus unfit for future uses in IC manufacturing. The acid bath treated wafers will thus need further treatments before they can be reused either for testing or for production purposes.

To address the above-mentioned problem of undesirable defectivity level, conventional IC manufacturers use a lapping/polishing technique after the acid stripping treatment to remove particles and/or to polish the wafer for removing surface defects on the wafer. The conventional lapping/polishing technique is essentially a mechanical polishing process using abrasives, normally contained in a chemical solution called slurry, during polishing of the wafer. During lapping/polishing, a polishing pad is used to grind the wafer. Therefore, the lapping/polishing technique may also be used to planarize the wafer, or to remove a layer, such as materials which are not removed by the prior acid bath treatment, on the wafer. During the lapping and mechanical polishing step, deionized water may flow through the wafer to cool down heat generated by polishing and to remove particles and/or scraps during polishing.

The lapping/polishing technique is, however, not without disadvantages. For instance, the abrasives used in lapping/polishing technique are often quite rough. Thus, the wafer polished by lapping/polishing would normally lose at least 25 μm in thickness per lapping/polishing run. Moreover, the lapping/polishing technique is very difficult to be controlled precisely, particularly to a large surface area. As a result, uneven thickness on various portions of a wafer might often result from the lapping/polishing process. Therefore, the lapping/polishing technique is unfit for a larger surface size wafer, such as an 8-inch or a 12-inch wafer, and is often unacceptable to the modern deep sub-micron technology due to its roughness.

The third conventional step in reclaiming a wafer is to clean the stripped-and-polished wafer. Clean wafers are essential at all stages of the fabrication process but are especially necessary before any of the operations performed at high temperature. The cleaning may be accomplished by a conventional non-contact cleaning procedure, i.e., the wafer is not touched by a cleaning equipment such as a brush during cleaning, and the cleaning is usually performed in a wet bench. In the past, the non-contact cleaning is predominantly used to clean the wafer during the manufacturing processes by the semiconductor industry. For instance, a sonic wave cleaning technique is probably one of the most commonly used non-contact cleaning techniques. Sonic waves are energy waves generated by a transducer. Two ranges of sonic waves are often used. The first range of approximately 20,000–50,000 Hz is called the ultrasonic waves and the second range of approximately 850 kHz is called the megasonic waves. In the megasonic/ultrasonic cleaning procedure, the wafer may be immersed in the deionized water or the deionized water may be dripping on the wafer. The sonic waves pass through the deionized water and cause particles or residues on the surface of the wafer to fall off.

The megasonic/ultrasonic cleaning is, however, effective only to remove those particles loosely attached to the wafer. It is not effective when a certain sort of attractive forces, whether chemically or physically, exist between the particles and the wafer. For instance, a particle and the wafer will be attractive to each other if they respectively have opposite electrical charges existing on them. They will also be attractive to each other when a certain kind of chemical bonding force exists between the particle and the wafer. For these situations, megasonic/ultrasonic cleaning is ineffective and other cleaning step is needed to remove the particles or residues on the wafer more effectively in order to provide an extremely clean wafer suitable for reuse.

SUMMARY OF THE INVENTION

An object of the present invention is to provide a new method for reclaiming or restoring semiconductor wafers to their original-like pre-used state suitable for reuse. The object is met by using a chemical mechanical polishing (CMP) procedure and/or a wafer scrubbing procedure during the restoring or reclaiming method according to the present invention, as indicated in the claims appended hereto.

Accordingly, one embodiment of the present invention provides a wafer scrubbing procedure by using a poly-vinyl-acetate (PVA) brush to remove particles and/or residues on the wafer. In a preferred embodiment, the present invention further comprises a CMP procedure before the wafer scrubbing procedure to polish the wafer and a cleaning procedure after the wafer scrubbing procedure to restore the wafer back to the original-like condition.

The foregoing and additional features and advantages of the present invention will become apparent by way of non-limitative examples shown in the accompanying drawings and detailed description that follow. In the figures and written description, numerals indicate the various features of the invention, like numerals referring to like features throughout for both the drawing figures and the written description.

BRIEF DESCRIPTIONS OF THE DRAWINGS

DETAILED DESCRIPTION OF THE INVENTION

Figure 1:
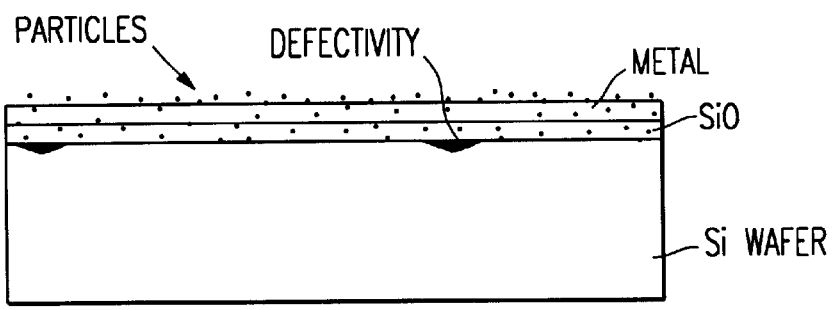
FIG. 1 shows a semiconductor wafer before a restoring process according to the present invention.

Conventionally, a wafer scrubbing procedure has never been specifically used in reclaiming or restoring a test or used wafer. In one embodiment, the present invention uses the wafer scrubbing procedure to restore the wafer for the purpose of reusing the restored wafer in testing or production purposes. The wafer scrubbing is a contact cleaning technique and, in recent years, it has become increasingly popular to provide a more effective cleaning of the wafer for the IC manufacturing industry. In general, the wafer scrubbing technique uses a brush, or the like, directly brushing a surface of the wafer to remove particles on the surface. During the wafer scrubbing, the wafer is typically placed on a rotating plate and a rotating brush is brought into contact with the surface of the wafer while a stream of deionized water is directed onto the surface of the wafer to flush away particles. In a preferred embodiment, a detergent or some chemicals are added to the water to increase the effectiveness and to prevent static built up among the wafer and the particles. The brush material should be also carefully chosen to prevent attractive electric potential built up between the particles, or residues, and the wafer. Otherwise, the particles or residues would make it harder to be removed. In the preferred embodiment, a poly-vinyl-acetate (PVA) brush is used in the wafer scrubbing because the PVA often leads to a repulsive potential existing between the particles, or residues, and the wafer during wafer scrubbing and thus makes flushing away particles easier. However, in alternative embodiments, other materials suitable to brush particles without causing attractive potential between particles and the wafer may also be used.

The wafer scrubbing procedure is typically a post CMP procedure used to clean the wafer. In the preferred embodiment, the present invention thus further comprises a Chemical Mechanical Polishing (CMP) procedure before the wafer scrubbing procedure to restore the test or used wafers. This is significant because, even though the CMP has been widely utilized in manufacturing processes of semiconductor devices or integrated circuits, it has never been specifically used and/or disclosed in reclaiming or restoring used semiconductor wafers or substrates.

The chemical Mechanical Polishing technique has been conventionally used for planarizing or polishing semiconductor wafers or substrates in the semiconductor industry over the last several years. The surface of a semiconductor wafer has to be free of irregularities and be extremely flat before it could be used to manufacture semiconductor devices or integrated circuits on the wafer. Otherwise, any irregularities, such as surface defects and/or unevenness, on the surface of the wafer may greatly reduce the yield rate of manufacturing semiconductor devices of the wafer. Furthermore, planarization steps are also often required during a series of process steps in manufacturing integrated circuits formed on the semiconductor wafer. For instance, during formation steps of inter-layer dielectrics (ILD) or pre-metal dielectrics (PMD), the CMP or other planarization techniques will be applied to the wafer for planarizing the ILD or PMD deposited on the wafer in order for following process steps to take place. Without applying the planarization step first, every following process step, such as a photography definition of a metal layer, would be unable to provide a good quality result, and the reliability of the semiconductor devices or integrated circuits will thus be seriously compromised.

The requirement of planarization is even more important in making modern deep sub-micron range semiconductor devices and/or integrated circuits. For example, a channel length of a typical modern MOS device has been shrunk to under 0.35 $\mu$m. Any slight morphological variations of the substrate or of deposited layers over the substrate might potentially introduce defects into the MOS device during the manufacturing process. Thus, many planarization techniques have been developed over the decades. Although other planarization techniques might be useful, the CMP technique, however, provides many advantages over other planarization techniques and is particularly suitable for modern semiconductor manufacturing processes. Specifically, one unique advantage of the CMP over other planarization techniques is to accurately control a polishing rate of the wafer without causing thickness variation across the wafer, i.e., the CMP provides a much uniform global planarization result to the wafer than other planarization techniques could offer. In addition, the CMP controls more accurately the polishing rate than other planarization techniques do. Therefore, the CMP became a favored process for planarizing the wafer.

Typically, the CMP may control the polishing rate of the wafer down to approximately 0.2–0.5 $\mu$m/min. On the contrary, the conventional lapping and mechanical polishing technique often consumes approximately 25 $\mu$m or more in thickness per run and thus is unfit for modern manufacturing purposes. A principal difference between the CMP and the conventional lapping/polishing is thus that the former may be used to remove less than 2 $\mu$m in thickness of the substrate material while the latter removes at least 25 $\mu$m in thickness of the substrate material each run. A wafer cannot be too thin to be useful in manufacturing semiconductor devices or integrated circuits. Thus, depending on specifications of each factory, the conventional lapping/polishing technique can only reclaim the wafer approximately twice without losing its usefulness. In contrast, the present invention may be used to reclaim or restore the used wafer approximately more than 50 times. As a result, the present invention provides tremendous advantages over the convention technique.

The CMP procedure is a combination of chemical etching and mechanical polishing steps during a semiconductor manufacturing process. In general, the CMP uses a chemical solution, often referred to a slurry, for etching deposits over the wafer during a mechanical polishing step. During the CMP, the wafer is often fixedly positioned on a platen table and is pressed, normally at approximately 5–30 psi, against a polishing pad. Both the wafer and the polishing pad are normally in round shape wherein the polishing pad has a much larger diameter than the wafer does. During the CMP, the platen table rotates, so does the wafer, in a first direction at a speed up to 1000 rpm. Likewise, the polishing pad rotates, at a speed also up to 1000 rpm but in a second direction opposite to the first, during the CMP.

In the preferred embodiment, the polishing pad is made of poly-urethane material, such as commercially available products IC 1000 or IC 1400. In other embodiments of the invention, the polishing pad, however, may be made of other suitable materials such as a poly-urethane impregnated polyester material, e.g., commercially available products like Suba IV or Politex.

Another important feature of the CMP is its pad dresser for polishing pad re-conditioning. The pad dresser comprises silicon carbide or diamond grits. The pad dresser, which is positioned in contact with the polishing pad, rotates and moves in a back-and-forth fashion for re-conditioning the whole surface of the polishing pad during the CMP. As a result, the pad dresser maintains the polishing pad in a proper condition for a better result of the CMP. In contrast, there is no pad re-conditioning in the conventional lapping/polishing technique.

The slurry contains abrasives suspended in a pH-value adjusted chemical solution. The slurry solution of the present invention can be basic or acidic. One of the principal operations during the CMP is that when a target material, such as a dielectric layer or a metal layer, is being polished, chemicals added in the slurry solution will react with topmost atoms of the surface of the target material causing the surface of the target material softened up, or being oxidized, and become easier to be polished. The slurry solution may comprise $KOH$, $NH_4OH$, $H_2O_2$, $KIO_3$, or $Fe(NO_3)_3$ based chemistries, and the abrasives may contain $SiO_2$, $CeO_2$, $Al_2O_3$, or diamond chips. In the wafer reclaiming or restoring process according to the present invention, one or more CMP procedures may be included for a better result. Additionally, in each CMP procedure, various combinations of chemistries in the slurry solution, the polishing pad material, the rotational speeds of the platen table and/or of the polishing pad, or the abrasive materials may be chosen. As a result, by carefully choosing the abrasives, the slurry chemistries, the pH value of the slurry, the rotational speeds of the platen table and/or of the polishing pad, or the polishing pad materials, inter alia, individually or in combination, a manufacturer may customize the reclaiming or restoring process to achieve a best result. This customizable feature of the present invention offers great advantages over the conventional reclaiming or restoring techniques.

In the preferred embodiment, the present invention further comprises a procedure of acid stripping for the wafer to be reclaimed or restored. This acid stripping procedure, if included, is often the first step in the reclaiming or restoring process. The acid stripping procedure is conventional and persons skilled in the art will be able to choose appropriate chemical solution for the acid stripping procedure. In the preferred embodiment, the CMP procedure follows the acid stripping procedure, and the PVA scrubbing procedure follows the CMP procedure. In one embodiment, the CMP procedure may replace the acid stripping procedure and thus dispense with the acid stripping procedure. An advantage of dispensing with the acid stripping procedure is a reduction of cycle time in the reclaiming process. In yet another embodiment, the PVA scrubbing procedure may follow the acid stripping procedure directly and thus dispense with the CMP procedure in the reclaiming process.

In the preferred embodiment, the PVA scrubbing procedure may further be followed by a cleaning procedure. The cleaning procedure may be a wet bench cleaning, such as the conventional megasonic/ultrasonic cleaning, or a spray rinsing cleaning, both of which are well known to persons skilled in the art. In the spray rinsing procedure, the wafer may rotate around an axis and acidic chemicals may be added to a spray liquid forming a chemical solution to make the cleaning procedure more effective. Furthermore, the chemical solution of the spray rinsing procedure may comprise HF or SC1 solution, and the rotational speed of the wafer in spray rinsing may vary to achieve a more effective cleaning of the wafer.

As an exemplary summary, the present invention may comprise one of the following five non-limitative embodiment examples:

A. (1) acid stripping, (2) PVA scrubbing;
B. (1) acid stripping, (2) CMP, (3) PVA scrubbing;
C. (1) acid stripping, (2) CMP, (3) PVA scrubbing, (4) cleaning;
D. (1) CMP, (2) PVA scrubbing;
E. (1) CMP, (2) PVA scrubbing, (3) cleaning.

Figure 2:
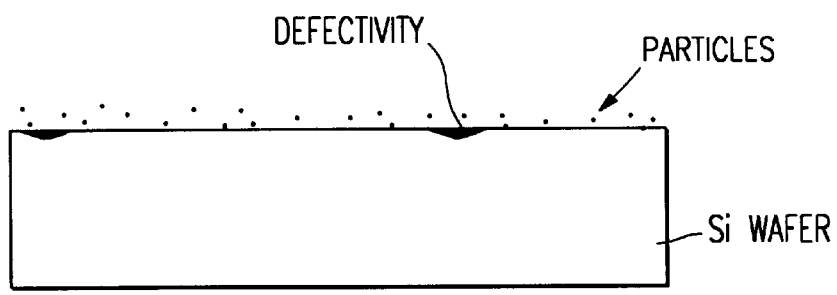
FIG. 2 shows the wafer after a chemical stripping according to the present invention.
Figure 3:
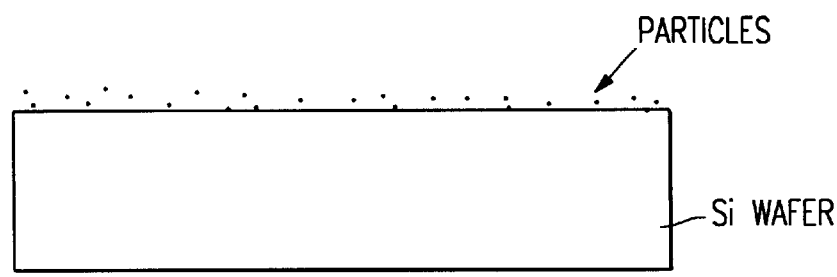
FIG. 3 shows the wafer after the chemical stripping and a CMP according to the present invention.
Figure 4:
FIG. 4 shows the wafer after the chemical stripping, the CMP, a PVA scrubbing, and a wafer cleaning according to the present invention.

FIG. 1 shows a test wafer having an $SiO_2$ and a Metal layer deposited on the wafer. As shown in FIG. 1, particles are present in the Metal and $SiO_2$ layers and on the surface of the wafer, and surface defects are also commonly present on the surface of the wafer. FIG. 2 shows the wafer after an acid stripping procedure wherein the Metal and the $SiO_2$ layers are stripped from the wafer. As shown, particles and surface defects are still present on the surface of the wafer after acid stripping. FIG. 3 shows the wafer after a CMP procedure wherein surface defects are removed but particles may still be present. FIG. 4 shows, according to the present invention, the wafer after a PVA scrubbing procedure and/or a cleaning procedure wherein all particles are removed. Thus, the wafer is clean and free of surface defects ready for reuse with minimum thickness (often less than approximately 2 $\mu$m) being removed.

From the foregoing, it can be appreciated that, although specific embodiments of the invention have been described herein for purposes of illustration, various modifications may be made by persons skilled in the art without deviating from the spirit and/or scope of the invention. Particularly, the present invention may be used to reclaim a patterned wafer, i.e., the scrapped wafer in a later production stage of the semiconductor manufacturing processes. The present invention is also useful to reclaim an ion-implanted wafer, i.e., the ion-implanted wafer for testing or for production purposes. Doping profiles of the ion-implanted wafer may be erased by the present invention to make the restored wafer re-useable. Likewise, the present invention may be used to reclaim a photo-resist coated and/or spin-on-glass coated wafer. The present invention may be used for a larger size wafer, such as the wafer of 12-inch or larger diameter. In addition, the present invention may reclaim not only silicon material wafers but also other material wafers, such as wafers made of III–V compound semiconductor materials. The present invention is particularly advantageous for applications in the modern semiconductor industry with deep-submicron technology. The present invention is applicable to reclaim or restore an epi-grown wafer.

Finally, the present invention may be used to reduce the thickness loss when obtaining a virgin-wafer from an ingot as compared to the conventional technique of lapping/polishing. To create a wafer from the ingot, the conventional technique cuts the ingot to form the wafer slice. After cutting, the conventional technique then uses lapping/polishing to perfect the surface of the wafer. Typically, the conventional technique require a substantial amount of extra wafer thicknesses, i.e., approximately 100 $\mu$m, reserved for consumption during the conventional lapping/polishing procedure. As stated, the CMP consumes far fewer target materials than the conventional lapping/polishing does (approximately 2 $\mu$m versus 25 $\mu$m each run). By using the CMP, the present invention may substantially reduce the thickness loss when obtaining a wafer from the ingot and, thus, increase the number of wafer slices that may be obtained from the ingot. As a result, the present invention may potentially save huge amounts of costs or increase large volume of revenues to an IC factory.

What is claimed is:

1. A method for restoring a previously processed semiconductor substrate to an original-like condition suitable for reuse in testing or production purposes, said restoring method comprising a scrubbing procedure which comprises:

a. positioning the substrate on a first support means;
   b. rotating the first support means at a first speed;
   c. placing a first basic or acidic chemical solution onto a first surface of the substrate;
   d. pressing a brush against the first surface of the substrate at approximately 5–30 psi, the brush being made of a material adapted to generate a repulsive electrical potential between particles or residues on the substrate and the substrate itself; and
   e. scrubbing the surface of the semiconductor substrate by rotating the brush at a second speed, said scrubbing of the substrate removing the particles or residues on the surface of the substrate thereby rendering the substrate to the original-like condition suitable for reuse.

2. The restoring method of claim 1 wherein said first chemical solution comprises $NH_4OH$, SC1, HCl, HF, or citric acid based chemistries.

3. The restoring method of claim 1 wherein the brush material is poly-vinyl-acetate.

4. The restoring method of claim 1, further comprising:
   providing deionized water to the substrate by immersing the substrate in the deionized water or by dripping the deionized water on the substrate; and
   generating megasonic or ultrasonic waves of the deionized water by a transducer means during the scrubbing step e.

5. The restoring method of claim 1, before said scrubbing procedure said restoring method further comprising a chemical mechanical polishing (CMP) procedure which comprises:

a. positioning the substrate on a second support means;
   b. rotating a polishing pad at a third speed;
   c. placing a slurry solution onto a polishing surface of the polishing pad adapted to polish the substrate;
   d. rotating the second support means at a fourth speed;
   e. moving the second support means or the polishing pad to urge the first surface of the substrate to be polished against the polishing surface of the polishing pad;
   f. polishing the first surface of the substrate.

6. The restoring method of claim 5 wherein the slurry comprises:
   a second acidic or basic chemical solution; and
   abrasives for polishing the substrate.

7. The restoring method of claim 6 wherein said second chemical solution comprises KOH, $NH_4OH$, $H_2O_2$, $KIO_3$, or $Fe(NO_3)_3$ based chemistries.

8. The restoring method of claim 6 wherein said abrasives comprise $SiO_2$, $CeO_2$, $Al_2O_3$, or diamond chips.

9. The restoring method of claim 5 wherein the polishing pad comprises poly-urethane material.

10. The restoring method of claim 5 wherein the polishing pad comprises poly-urethane impregnated polyester material.

11. The restoring method of claim 5 wherein both the third and the fourth speeds are up to approximately 1000 rpm.

12. The restoring method of claim 5, before said CMP procedure further comprising a step of stripping a deposited layer on the surface of the substrate by directing a third acidic based chemical solution on the substrate.

13. The restoring method of claim 5, after said scrubbing procedure said restoring method further comprising a cleaning procedure.

14. The restoring method of claim 13 wherein said cleaning procedure comprises:

positioning the substrate within a liquid rinsing means;

generating sonic waves by a transducer positioned in the vicinity of the liquid rinsing means; and removing particles or residues on the substrate by the sonic waves.

15. The restoring method of claim 13 wherein said cleaning procedure comprises using a spray rinsing means to remove particles or residues on the substrate.

16. The restoring method of claim 13, before said CMP procedure said restoring method further comprising a step of stripping a deposited layer on the surface of the substrate by directing a fourth acidic based chemical solution on the substrate.

17. The restoring method of claim 1, before said scrubbing procedure said restoring method further comprising a step of stripping a deposited layer on the surface of the substrate by directing a fifth acidic based chemical solution on the substrate.

* * * * *